United States Patent [19]

Goyal

[11] Patent Number: 4,901,078
[45] Date of Patent: Feb. 13, 1990

[54] VARIABLE DUTY CYCLE WINDOW DETECTING ANALOG TO DIGITAL CONVERTER

[75] Inventor: Ramesh C. Goyal, Bothell, Wash.

[73] Assignee: John Fluke Mfg. Co., Inc., Everett, Wash.

[21] Appl. No.: 227,428

[22] Filed: Jul. 29, 1988

Related U.S. Application Data

[63] Continuation of Ser. No. 852,723, Apr. 14, 1986, abandoned.

[51] Int. Cl.[4] .............................................. H03M 1/40
[52] U.S. Cl. .................................... 341/163; 341/131; 341/139; 324/99 D
[58] Field of Search ............... 341/131, 139, 142, 143, 341/155, 156, 163, 164, 165, 166; 324/99 D

[56] References Cited

U.S. PATENT DOCUMENTS

| | | | |
|---|---|---|---|
| 2,907,021 | 9/1959 | Woods | 340/870.21 X |
| 3,422,423 | 1/1969 | Kaszynski | 340/347 DA |
| 3,588,881 | 6/1971 | Gordon | 341/163 |
| 3,703,002 | 11/1972 | Van Saun | 340/347 AD |
| 3,816,803 | 6/1974 | Gordon | 341/155 |
| 3,827,046 | 7/1974 | Watson | 341/164 |
| 3,918,050 | 11/1975 | Dorsman | 341/158 |
| 4,112,428 | 9/1978 | Dorsman | 341/158 |
| 4,342,983 | 8/1982 | Weigand et al. | 341/156 |
| 4,369,432 | 1/1983 | Mikami | 340/347 DA |
| 4,485,372 | 11/1984 | Holloway | 340/347 AD |
| 4,555,692 | 11/1985 | Eng et al. | 340/347 AD |
| 4,724,419 | 2/1988 | Kreuzer | 341/156 |

OTHER PUBLICATIONS

The Engineering Staff of Analog Devices, Inc., Analog-Digital Conversion Handbook, 6/1972, pp. I-34 & I-35.

Primary Examiner—William M. Shoop, Jr.
Assistant Examiner—H. L. Williams
Attorney, Agent, or Firm—Mikio Ishimaru; John Dellett

[57] ABSTRACT

A high resolution analog to digital (A/D) converter amplifies and filters a magnitude difference between a pulse width modulated offset voltage and an input voltage to produce an amplified filtered difference voltage, the duty cycle of offset voltage modulation being adjusted such that the magnitude of the difference voltage is within a narrow input voltage range of a recirculating remainder A/D converter. The amplified, filtered difference voltage is converted to representative digital data by the recirculating remainder A/D converter. A microprocessor, which controls the offset voltage, combines the result with the magnitude of the offset voltage to produce a comparatively high resolution digital representation of the input voltage.

18 Claims, 2 Drawing Sheets

VARIABLE DUTY CYCLE WINDOW DETECTING ANALOG TO DIGITAL CONVERTER

This is a continuation of application Ser. No. 852,723, filed Apr. 14, 1986, and now abandoned.

BACKGROUND OF THE INVENTION

The present invention relates in general to analog to digital converters and in particular to computer based analog to digital converters of the type employing iterative processes to achieve high resolution conversion.

Analog to digital (A/D) converters typically utilize costly precision resistors and as the resolution and accuracy of a converter are increased, so too are the number of precision resistors in the converter. For instance, a ladder network A/D converter of the prior art utilizes a precision resistor network to produce a plurality of reference voltages of differing magnitudes. An input voltage is compared with each reference voltage and the approximate magnitude of the input voltage is found by determining which reference voltages are larger and which reference voltages are smaller than the input voltage. The number of precision resistors and comparators required increases with the resolution of the converter, and therefore high resolution A/D converters of this type are costly.

A typical ramp type A/D converter of the prior art utilizes a D/A converter to produce a reference voltage which is compared by a comparator to an input voltage to be digitized. The reference voltage is incrementally increased by increasing input data to the D/A converter until the comparator indicates that the reference voltage exceeds the input voltage. At this point the input data driving the D/A converter approximates the input voltage. Although the D/A converter utilized in a ramp A/D converter usually contains precision resistors and a comparator, fewer precision resistors and comparators are required by a ramp A/D converter than is required by a ladder network A/D converter for the same degree of resolution. Nonetheless, the number of precision resistors required increases in proportion to the desired resolution so that high resolution ramp type converters are also expensive.

Some computer-based A/D converters use iterative processes to expand the resolution of an A/D converter. One such computer-based A/D converter, described in U.S. Pat. No. 4,555,692, issued Nov. 26, 1985 to Eng, Jr. et al, is a "recirculating remainder" A/D converter employing a conventional ramp type A/D converter which initially digitizes an input voltage to produce a low resolution "first pass" digital representation of the input voltage. The difference between the input voltage and the final reference voltage produced by the ramp A/D converter during the first pass measurement (the "remainder voltage") is then amplified and applied as a "second pass" input to the ramp A/D converter which then produces a digital representation of the remainder voltage. The second pass converter output data is then divided and added to the first pass converter output data to produce a higher resolution "second pass" representation of the input voltage. A second remainder voltage comprising the amplified difference between the first remainder voltage and the final reference voltage produced by the ramp A/D converter during the second pass is then digitized by the ramp A/D converter during a "third pass" through the converter with the result being divided and added to the second pass representation to produce a still higher resolution "third pass" representation of the input voltage. The process may be repeated several times to obtain progressively higher resolution representations of the input voltage. However noise introduced by the measurement apparatus usually becomes the predominant source of the remainder voltage after not more than five passes and the accuracy of the output of such recirculating remainder A/D converters is typically limited to about 18 significant bits.

In addition to digitizing input voltages with high resolution and accuracy, a precision A/D converter should also operate with a high degree of linearity over a wide input range, should be easy to calibrate, and should remain calibrated for long periods. Precision A/D converters of the prior art typically require use of specialized test equipment and careful manual adjustment of variable capacitors or potentiometers for calibration.

SUMMARY OF THE INVENTION

According to one aspect of the invention, a high resolution analog to digital (A/D) converter utilizes a comparatively low resolution, narrow input range, analog to digital converter (hereinafter called "window detector") to develop digital representations of the magnitudes of a wide range of input voltages with comparatively high resolution. A microprocessor controlled autoranging circuit initially scales an input voltage to be digitized to a level within the input range of the window detector and the window detector then converts the scaled input voltage into representative first digital data. This data is provided to the microprocessor controlling the autoranging circuit and the microprocessor determines the approximate magnitude of the input voltage from this data. The microprocessor then adjusts the autoranging circuit to increase the magnitude of the scaled input voltage by a factor of 10. Next the microprocessor applies digital control data to a signal generator causing it to produce an offset voltage of known magnitude differing from the magnitude of the scaled input voltage by an amount equal to approximately 1/100th of the full scale input limit of the window detector. A difference amplifier then amplifies the voltage difference between the offset and input voltages by a factor of 100 and the amplified difference voltage is converted by the window detector into representative second digital data transmitted to the microprocessor.

The microprocessor then computes third digital data representing the input voltage with high resolution based on the known magnitude of the offset voltage, the scaling factor of the autoranging circuit, the magnitude of the second digital data and the amplification of the difference amplifier. In the preferred embodiment of the invention, the window detector digitizes with 18 bit resolution and the signal generator produces offset voltages of magnitude controlled with 14 bit resolution. This combination of components permits the microprocessor to characterize an input signal with 28 bit resolution.

According to another aspect of the invention, the window detector comprises a recirculating remainder analog-to-digital converter of the type described in U.S. Pat. No. 4,555,692 issued Nov. 26, 1985 to Eng et al and incorporated herein by reference. This window detector digitizes input voltages with 18 bit resolution, provides highly stable and highly linear operation over an input voltage range of ±2 volts and is self calibrating, requiring no manual adjustments by an operator. In the preferred embodiment of the invention, the autoranging circuit is adapted to scale an input voltage by factors of 1/1000, 1/100, 1/10, 1, 10 and 100 and permits the use of the narrow range window detector in digitizing input voltages ranging from approximately −1200 to +1200 volts.

According to a further aspect of the invention, the signal generator which produces the offset voltage comprises a programmable duty cycle generator clocked by a crystal oscillator. The duty cycle generator produces a square wave signal of a duty cycle determined according to the magnitude of the control data provided by the microprocessor. The square wave signal modulates a known DC reference voltage to produce the offset voltage signal which is also a square wave but which has a time average magnitude proportional to the duty cycle of the counter output. The difference signal produced by the difference amplifier is therefore pulsed but a filter is provided to convert this pulsed difference signal to a DC voltage before it is applied to the input of the window detector. In the preferred embodiment of the invention, the crystal oscillator operates at 10 MHz and permits control with 14 bit resolution over the output signal duty cycle. Since the crystal oscillator frequency is highly stable, the time average magnitude of the offset voltage is a highly stable function of the control data applied to the duty cycle generator and can be adjusted to a known magnitude with a high degree of accuracy.

The combination of a crystal oscillator clocked duty cycle generator to produce a precision offset voltage with the recirculating remainder A/D converter of the prior art and the autoranging circuit permits the present invention not only to digitize input signals with high resolution, accuracy and linearity, such combination also permits the device to be easily and automatically calibrated without manual adjustment. Also, since the window detector and the crystal oscillator controlled A/D converter are highly stable, the D/A converter of the present invention typically remains accurately calibrated for a long time.

It is accordingly an object of the invention to provide an improved analog-to-digital converter and operating method for digitizing input voltages with a high degree of resolution, accuracy and linearity.

It is another object of the invention to provide an improved analog-to-digital converter and operating method which is easy to calibrate and which can operate for long periods without need for recalibration.

Both the organization and method of operation of the present invention, together with further advantages and objects thereof, may best be understood by reference to the following description taken in conjunction with accompanying drawings wherein like reference characters refer to like elements.

DRAWINGS

DETAILED DESCRIPTION

Figure 1:
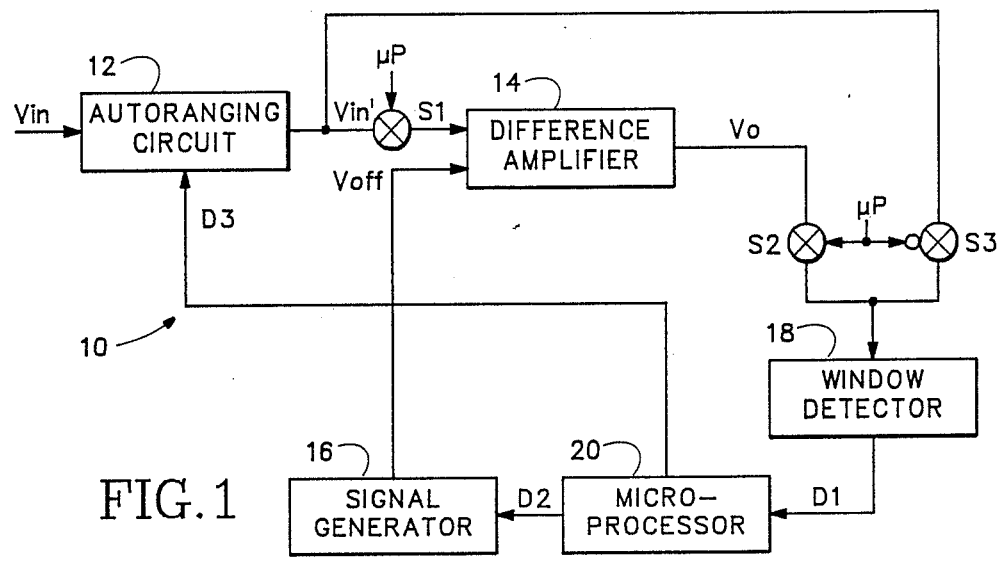
FIG. 1 is a block diagram of the analog to digital converter of the present invention.

Referring to FIG. 1, a variable duty cycle, window detecting, analog to digital converter 10 according to the present invention, depicted in block diagram form, is adapted to convert an analog input voltage Vin into representative digital data. The input voltage Vin is applied to an autoranging circuit 12 which can selectively scale the input voltage by a factor of 0.001, 0.01, 0.1, 1, 10 or 100 in response to applied digital control data D3. The output voltage Vin' of autoranging circuit 12 is applied through a switch S1 to a difference amplifier 14. A signal generator 16 produces an offset voltage signal Voff also applied to the difference amplifier 14 and the amplifier produces an output voltage Vo which is 100 times larger than the difference between Vin' and Voff. The output voltage Vo of amplifier 14 is applied through another switch S2 to the input of a window detector 18, comprising a narrow range A/D converter adapted to produce output data D1 representative of the magnitude of Vo. The output Vin' of autoranging circuit 12 is also provided as an input to window detector 18 through a switch S3 so that when switch S2 is open and switch S3 is closed, the output data D1 of window detector 18 represents the magnitude of Vin' rather than of Vo. The digital output data D1 of the window detector 18 is applied as input data to a microprocessor 20 which supplies a digital output D2 for controlling the magnitude of the offset voltage output Voff of the signal generator 16. Microprocessor 20 also generates the data D3 which controls the range selection of autoranging circuit 12 and generates signals which control the switch positions of switches S1, S2 and S3.

Figure 2:
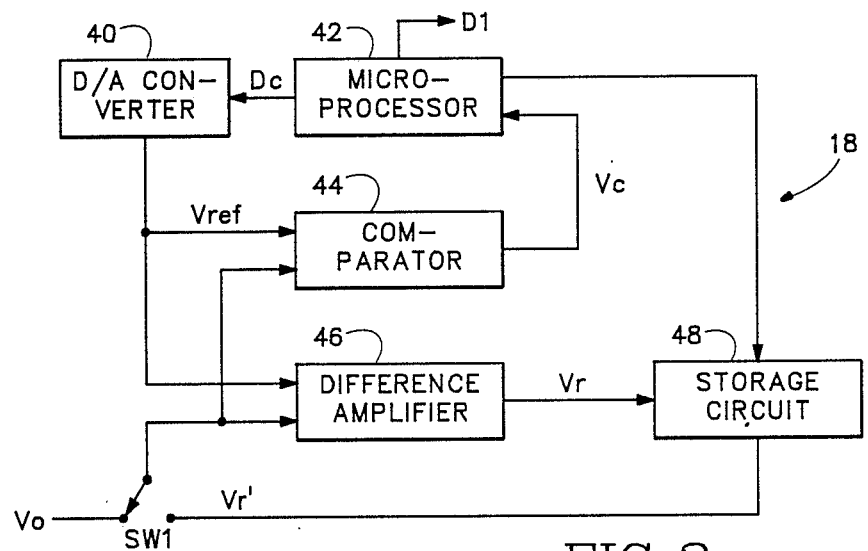
FIG. 2 is a block diagram of a window detector of the prior art.

In the preferred embodiment of the invention, the window detector 18 is a recirculating remainder analog to digital converter of the type described by Eng et al in U.S. Pat. No. 4,555,692 issued Nov. 26, 1985, incorporated herein by reference. Referring to FIG. 2, window detector 18 is depicted in simplified block diagram form to illustrate the operating principle of the window detector which is more fully described in the last mentioned patent. The window detector 18 includes a digital to analog converter 40 for outputting a reference voltage Vref of magnitude controlled by digital control data Dc from a microprocessor 42. (In the present invention, a single microprocessor may perform the functions of both microprocessor 42 of FIG. 2 and microprocessor 20 of FIG. 1.) An input signal Vo to be digitized is applied through a switch SW1 to a comparator 44 and the reference voltage Vref is applied as another input to the comparator. The comparator transmits an output signal Vc to microprocessor 42 indicating whether the magnitude of Vo exceeds the magnitude of Vref. The input signal Vo is also applied as one input to a difference amplifier 46 through switch SW1 and the reference voltage Vref is coupled as another input to the difference amplifier. The difference amplifier 46 generates a remainder voltage Vr which is a multiple of the voltage difference between Vref and Vo. This remainder voltage is stored by a storage circuit 48 on receipt of a control signal from microprocessor 42. The remainder voltage Vr' stored in storage circuit 48 may be connected as an input to difference amplifier 46 in lieu of Vo through switch SW1.

Initially switch SW1 is set to pass Vo rather than Vr' to amplifier 46 and the microprocessor 42 monitors the output Vc of comparator 44 while iteratively adjusting the output Vref of converter 40 until Vref is as close as possible to Vo. The microprocessor then stores the last value of Dc in a memory (not shown). The position of switch SW1 is changed to apply remainder voltage Vr', rather than Vo, as an input to comparator 44 and difference amplifier 46. Microprocessor 42 next iteratively adjusts the Vref output of converter 40 until Vref is as close as possible to the remainder voltage Vr' and stores the new value of Vref in memory. The difference amplifier 46 supplies a second remainder voltage Vr comprising the amplified difference between the first remainder voltage Vr' and Vref. The second remainder voltage is stored in storage circuit 48, replacing the first stored remainder voltage Vr'.

The second stored remainder voltage Vr' is applied as the input to comparator 44 and difference amplifier 46 and digitized in the same manner as the first remainder voltage. This process is repeated several times with the digital value Dc of Vref corresponding to each successive remainder voltage being stored in memory. The microprocessor then scales the stored Dc data corresponding to each remainder voltage by the cumulative amount of remainder amplification and sums the stored data Dc to produce data D1 representative of the value of Vo. In practice the operation of apparatus of FIG. 2 is limited to five remainder producing iterations because noise generated by the difference amplifier 46 and other components of the circuit becomes the predominate source of remainder voltage Vr after five iterations. The window detector described in the Eng et al patent is implemented using CMOS integrated circuitry, providing highly stable operation with respect to ambient temperature changes and producing a digital output representing the input voltage with 18 bit resolution. However, due to voltage handling limitations of CMOS circuitry, the window detector 18 has a relatively narrow input range of approximately ±2 volts.

The window detector 18 is utilized several times by the A/D converter 10 of the present invention in order to digitize an input signal Vin with a resolution much higher than 18 bits. First, during a "search mode" of operation, the digitizer utilizes the window detector twice to determine the magnitude of Vin within the resolution of the window detector. Since the window detector has a narrow input range, an unknown input voltage Vin is initially prescaled by dividing Vin by a large number (a factor of 1000 in the preferred embodiment of the invention) to produce a "first pass" input voltage to the window detector which is sure to be within the ±2 V full scale input range of the window detector, provided Vin is within ±2000 V. The window detector digitizes the first pass input voltage to produce a "first pass" digital output which is multiplied by a factor of 1000 to provide a first estimate of Vin. If Vin is less than 1000 volts, this first estimate of Vin is of relatively low resolution (somewhat less than the 18 bit resolution of the window detector) because, while the first pass window detector input voltage is digitized to 18 bit resolution, the prescaling of Vin causes the first pass window detector input voltage to be rather close to zero with respect to the full scale input range of the window detector, particularly if Vin is quite small. Thus one or more of the most significant bits of the first pass digital output of the window detector will be 0's when Vin is less than 1000 volts, and only the lower order bits of the first pass window detector output contribute significant information regarding the magnitude of Vin.

With the value of Vin approximated by the first pass estimate, Vin is next prescaled (multiplied or divided) by an appropriate amount, based on the first pass estimate of Vin, to produce a "second pass" window detector input voltage which is a substantial portion of either the +2 V or −2 v input voltage range limits of the window detector, for instance between 0.1 and 1.3 volts or between −0.1 and −1.3 volts depending on the polarity of the input voltage. The window detector then digitizes this second pass window detector input voltage to provide a "second pass" digital output representing the value of the second pass input voltage with substantially the full 18 bit resolution of the window detector.

Once the value of the second pass input voltage is known, the window detector is utilized a third time during a "measure" mode of digitizer operation to develop a high resolution representation of Vin. In the measure mode of operation, the digitizer increases the prescaling factor of the input voltage Vin by a factor of 10 to produce a "third pass" voltage which is 10 times larger than the second pass input voltage. The window detector does not directly digitize the third pass voltage. Instead, the digitizer estimates the value of the third pass voltage by multiplying the second pass output of the window detector by a factor of 10 and then generates an accurately adjusted offset voltage of a magnitude which is known with at least 28 bit and preferably with about 32 bit resolution and which differs from the estimated value of the third pass voltage by a predetermined amount. The third pass voltage is then reduced by the amount of the offset voltage (by means of a difference amplifier) to create a difference voltage. This difference voltage is amplified (for instance by a factor of 100) and then applied as an input to the window detector. The window detector digitizes this difference voltage during the measure mode of digitizer operation to produce a "third pass" digital output which, when divided by a factor of 100 represents the difference between the third pass input voltage and the offset voltage. According to the present invention, the magnitude of the offset voltage is adjusted so that the amplified difference voltage is also a substantial portion of the full scale input voltage limit +2 V of the window detector, for instance in the range of 0.1 volts to +1.3 volts, so that the window detector digitizes the difference voltage with substantially its full 18 bit resolution.

A higher resolution digital representation of the third pass voltage is then computed by dividing the third pass digital output of the window detector by 100 and adding the result to the known magnitude of the offset voltage. The input voltage is then determined by multiplying (or dividing) the computed value of the third pass voltage according to the attenuation (or gain) of third pass input voltage prescaling. The computed digital representation of the third pass voltage (and therefore the computed value of the input voltage) is of much higher resolution (approximately 28 bits) than the resolution of the window detector (18 bits) because the magnitude of the offset voltage is known with at least 28 bits resolution and because the window detector utilizes substantially its full 18 bit resolution capability to digitize the small amplified voltage difference between the third pass voltage and the offset voltage. The digital result is the appropriate adjustment to the lower order bits of the 28 bit offset voltage needed to compute the value of the third pass voltage with approximately 28 bit resolution.

Referring to FIG. 1, the microprocessor 20 places the converter 10 in the search mode of operation in which the first and second pass values of Vin are determined by first opening switches S1 and S2, closing switch S3, and setting data D3 such that the autoranging circuit 12 divides the input voltage Vin by 1000. The resulting first pass voltage Vin' is applied to the window detector 18 input through switch S3 and then digitized by the window detector with 18 bit resolution. The microprocessor 20 determines the approximate magnitude of the input voltage Vin from the resulting first pass output data D1 of the window detector and resets the autoranging circuit 12 gain (or attenuation) such that the second pass value of Vin' is as close as possible to, for instance, ±1.3 volts, which is a substantial portion of the full scale +/−2 volt limit of the input range of the window detector. The window detector 18 again digitizes Vin' to provide data D1 as the second pass digital output data to the microprocessor 20 indicating the second pass approximation of Vin' with 18 bit resolution.

Next, during the measure mode of operation, converter 10 more precisely determines the magnitude of Vin. In this mode the microprocessor 20 opens switch S3, increases the gain of autoranging circuit 12 by a factor of 10 and, based on the magnitude of the second pass window detector output data D1, adjusts the value of the D2 data controlling the operation of signal generator 16 so that the signal generator produces an offset voltage Voff wherein the difference between Voff and the third pass value of Vin' is as close as possible to 0.013 volts. The microprocessor 20 then closes switches S1 and S2 such that difference amplifier 14 produces an output voltage Vo equal to 100 times the difference between Voff and Vin', which is therefore on the order of 1.3 volts, a substantial portion of the full scale input voltage limit of the window detector so that the window detector 18 digitizes the difference voltage Vo with substantially full 18-bit resolution.

The third pass digital output data D1 represents the difference between Vin' and Voff amplified by the 100× gain of amplifier 14. Thus the microprocessor 20 can determine the magnitude of the third pass value of Vin' by dividing the third pass digital data D1 by 100 and adding it to the digital equivalent of the known magnitude of Voff, which the microprocessor determined from control data D2. The value of Vin is then ascertained from the computed third pass value of Vin' by multiplying Vin' by the gain (or attenuation) of the autoranging circuit 12.

The operation of the digitizer is best illustrated by discussing how it digitizes an input voltage Vin of, for instance, 12.3456789 volts. During the search mode of operation the microprocessor 20 initially sets the autoranging circuit 12 to divide the input voltage by 1000 so that the first pass value of Vin' is 0.0123456789 volts. This first pass input voltage Vin' is applied through switch S3 to the input of window detector 18 and then converted by window detector 18 into a first pass 18 bit digital output D1 indicating a Vin' voltage of 0.01234 volts. First pass data D1 does not convey the lower order bits of Vin' due to the resolution limitations of the window detector. The microprocessor 20 determines from D1, and from the attenuation setting of the autoranging circuit 12, that Vin is 12.34 volts, with 3½ digit (about 10 bit) resolution. The microprocessor 20 then sets the autoranging circuit 12 to divide by 10 so that the second pass magnitude of Vin' is 1.23456789 volts.

The second pass voltage Vin' is applied to the input of the window detector 18 through S3 and the window detector produces a second pass 18 bit digital output D1 indicating a second pass Vin' voltage of 1.23456 volts. The microprocessor 20 determines from this second pass value D1 and from the divide by 10 setting of the autoranging circuit that Vin is 12.3456 volts, with 5½ digit (about 18 bit) resolution.

At this point the microprocessor 20 places the converter 10 in the measure mode, changing the setting of the autoranger 12 so that it has a third pass gain of 1 (i.e., 10 times its second pass value of 0.1) so that the third pass value of Vin is 12.3456789 volts. The microprocessor sets the value of D2 such that the signal generator 16 produces an offset voltage Voff of known value as close as possible to 12.3326 volts (i.e., 0.13 volts less than the second pass estimate of Vin) with at least 28 bit accuracy. For this example it is assumed that Voff is actually a value of 12.3327124 volts. The microprocessor also opens switch S3 and closes switch S1 and S2. When Voff is 12.3327124 volts and Vin' is 12.3456789 volts, the difference voltage Vo produced by the difference amplifier 14, which has a gain of 100, is 1.29665 volts. The window detector 18 digitizes Vo and the third pass output D1 of window detector 18 will indicate that Vo is 1.29665 volts with 5½ digit (18 bit) resolution. Microprocessor 20 divides 1.29665 by 100, the gain of amplifier 14, to determine the 0.0129665 volt difference between Vin' and Voff. Since the microprocessor knows the magnitude of Voff to be 12.3327124 volts, it adds 0.0129665 to 12.3327124 to determine the magnitude 12.3456789 of the input voltage Vin with 8½ digit (28 bit) resolution.

Figure 3:
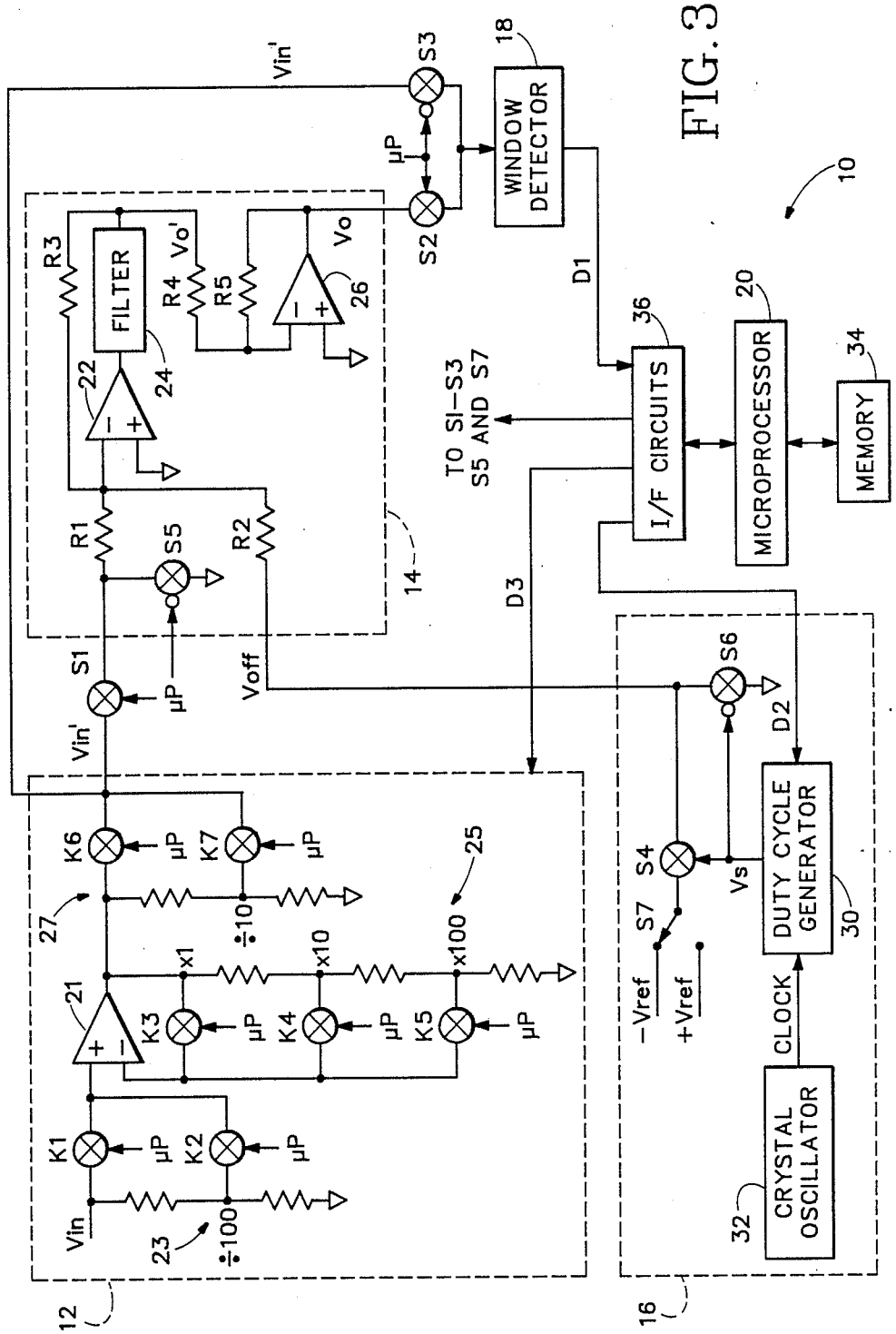
FIG. 3 is a more detailed combination block and schematic diagram of the analog to digital converter of FIG. 1.

Referring to FIG. 3, the A/D converter 10 of FIG. 1 is depicted in more detailed block and schematic diagram form including details of preferred embodiments of autoranging circuit 12, difference amplifier 14, and offset signal generator 16. Autoranging circuit 12 includes an operational amplifier 21, the Vin input to the autoranging circuit 12 being applied to a non-inverting input of amplifier 21 through a switch K1. Vin is also voltage divided by a factor of 100 by an input voltage divider 23 and the divided result is applied to the non-inverting input of amplifier 21 though another switch K2. The output of amplifier 21 is fed back to an inverting input of the amplifier through a switch K3 such that when switch K3 is closed, amplifier 21 has a gain of unity. The output of amplifier 21 is also applied to a resistor divider network 25 adapted to produce two voltages which are also fed back to the inverting input of amplifier 21 through a pair of switches K4 and K5, respectively, such that when switch K4 is closed amplifier 21 has a gain of 10× and when switch K5 is closed amplifier 21 has a gain of 100×. The output of amplifier 21 is further connected to an input of a switch K6 and to an output voltage divider 27 which divides the amplifier 21 output voltage by factor of 10, the divided result being applied as an input to another switch K7. The outputs of switches K6 and K7 are connected together to provide the Vin' output of the autoranging circuit 12.

The switching positions of all switches K1–K7 are controlled by data D3 from microprocessor 20 through well known interface circuitry 36. The switching states of switch K1 and switch K2 determine whether the input voltage signal Vin is initially divided by a factor of 100 prior to being applied to the amplifier 21. Amplifier 21 amplifies its input by a factor of 1, 10 or 100 depending on which switch K3, K4 or K5 is closed and switches K6 and K7 control whether the output of amplifier 21 is or is not divided by 10 in order to produce Vin'. Thus by controlling the states of switches K1-K7, the microprocessor 20 can adjust the autoranger 12 to produce a Vin' output having a magnitude which is selectively 1/1000th, 1/100th, 1/10, 1, 10 or 100 times the magnitude of the input Vin. The following Table I lists suitable settings for K1-K7 for various input voltage ranges during the search and measure modes of operation along with the resulting gain, Vin'/Vin of the autoranging circuit 12. In Table I a "+" symbol indicates the switch is closed and a "−" symbol indicates the switch is open.

TABLE I

| Input Volts (+ or −) | Switch | | | | | | | Gain |
|---|---|---|---|---|---|---|---|---|
| | K1 | K2 | K3 | K4 | K5 | K6 | K7 | |
| Search Mode | | | | | | | | |
| 0.0 to .13 | + | − | − | + | − | + | − | 10 |
| 0.1 to 1.3 | + | − | + | − | − | + | − | 1 |
| 1.0 to 13 | + | − | + | − | − | − | + | .1 |
| 10 to 130 | − | + | + | − | − | + | − | .01 |
| 100 to 1200 | − | + | + | − | − | − | + | .001 |
| Measure Mode | | | | | | | | |
| 0.0 to .13 | + | − | − | − | + | + | − | 100 |
| 0.1 to 1.3 | + | − | − | + | − | + | − | 10 |
| 1.0 to 13 | + | − | + | − | − | + | − | 1 |
| 10 to 130 | + | − | + | − | − | − | − | .1 |
| 100 to 1200 | − | + | + | − | − | + | − | .01 |

The difference amplifier 14 includes a pair of operational amplifiers 22 and 26 and a filter circuit 24. The Vin' input to difference amplifier 14 is applied through switch S1 and through a resistor R1 to an inverting input of amplifier 22. A non-inverting input of the amplifier 22 is grounded. The junction between switch S1 and resistor R1 is also grounded through another switch S5. The Voff output of D/A converter 14 is also applied to the inverting input of amplifier 22 through another resistor R2. The output of amplifier 22 is filtered by filter circuit 24 and then fed back to the inverting input of amplifier 22 through a resistor R3. The values of R1, R2 and R3 are adjusted such that amplifier 22 and filter 24 produce a filtered output Vo' of magnitude equal to the sum of the time average magnitudes of Vin' and Voff. The output Vo' is applied through a resistor R4 to an inverting input of amplifier 26 having a grounded non-inverted input and having an output fed back to its inverting input through a resistor R5. The values of R4 and R5 are selected such that the output Vo of amplifier 26 is 100 times larger than Vo'.

The signal generator 16 includes a duty cycle generator 30 clocked by a clock signal output of a 10 MHz crystal oscillator 32. The duty cycle generator 32 is adapted to produce a square wave output signal Vs of a duty cycle proportional to the magnitude of applied data D2 from microprocessor 20 (via interfacing circuits 36). The duty cycle generator operates by alternately driving Vs high and low for selected numbers of oscillator 32 clock signal cycles as determined by data D2. A switch S7 is provided to selectively connect either a positive or a negative offset reference voltage (+Vref or −Vref) to another switch S4. The output of switch S4 comprises the previously mentioned offset voltage Voff applied to the inverting input of amplifier 22 via resistor R2. The output of S4 is also connected to ground through another switch S6. The duty cycle controlled square wave output voltage Vs of duty cycle generator 30 controls the switching states of S4 and S6, which open and close in opposite phase relation to one another. The switching states of switches S1, S2, S3, S5 and S7 are all controlled by microprocessor 20 via interfacing circuits 36. While the instantaneous magnitude of Voff is either 0 or ±Vref at all times, the time average magnitude of the Voff signal is proportional to its duty cycle which is in turn proportional to data D2.

Signal generator 16 and amplifier 14 are utilized during the measure mode of operation. During the measure mode of converter 10 operation, switches S1 and S2 are closed while switches S3 and S5 are opened and microprocessor 20 sets switch S7 to connect +Vref to switch S4, if the microprocessor determines from the second pass estimate of Vin, ascertained during the previous search mode of operation, that Vin is negative. Conversely, microprocessor 20 sets switch S7 to connect −Vref to switch S4 if Vin was previously determined to be positive. Also during the measure mode of operation, the microprocessor applies data D2 to duty cycle generator 30 to control the duty cycle of Vs such that the time averaged magnitude of the pulse width modulated Voff signal is as close as possible to 0.13 volt larger than the third pass value of Vin' but of opposite polarity. Amplifier 22 then produces a pulse width modulated output signal of time averaged magnitude proportional to the sum of Vin' and the time average value of Voff. Since Vin' and Voff are of different polarities, the output of amplifier 22 is proportional to the difference between the absolute values of the two voltages. The output of amplifier 22 is filtered by filter 24 to produce a DC output Vo' which is amplified by a factor of 100 by amplifier 26 to produce Vo.

Since the crystal oscillator 32 clock frequency is highly stable, the time average magnitude of the offset voltage of Voff is a highly stable function of the control data applied to the duty cycle generator 30 and can be adjusted to a known magnitude with a high degree of accuracy. The combination of a crystal oscillator clocked duty cycle generator, to produce a pulse width modulated offset voltage, with the recirculating remainder A/D converter of the prior art and the autoranging circuit permits the present invention not only to digitize a wide range of input voltages with high resolution, accuracy and linearity, it also permits the converter 10 of the present invention to be easily calibrated without manual adjustment of variable capacitors or resistors as is typically required for high resolution converters of the prior art.

The microprocessor calibrates the converter 10 automatically. Operational amplifiers 22 and 26 of the difference amplifier 14 introduce an offset error into the output voltage Vo of the difference amplifier and in a first calibration step, the offset error of the difference amplifier 14 is measured. Referring to FIG. 3, switches S1 and S3 are opened and switches S2 and S5 are closed and the duty cycle of signal generator 16 is set to zero (i.e., switch S6 remains closed) such that Voff is 0. The input to amplifier 22 is therefore 0 volts and the output Vo of amplifier 26 represents the offset error of the difference amplifier 14. The window detector 18 digitizes Vo and the microprocessor 20 stores the window detector output data D1 representing Vo in a nonvolatile memory 34. Thereafter the microprocessor 20 corrects the output D1 of the window detector 18 by this measured offset error value.

Next the window detector 18 is calibrated to account for errors in the values of internal resistors used to produce reference voltages and for any offset or gain errors associated with components within window detector 18. The microprocessor 20 obtains the output data D1 of the window detector 18 in response to several different window detector input voltages Vo ranging from −2 to +2 volts and uses the results to calibrate the window detector 18 in the manner described in the previously mentioned U.S. Pat. No. 4,555,692. The several input voltages are generated by opening switches S1 and S3, closing switch S5, and then using the signal generator 16 to produce offset voltages Voff of time averaged magnitude ranging between −0.02 and +0.02 volts. The difference amplifier 14 then amplifies these offset voltages by a factor of 100, filters them, and then applies them as the Vo inputs to window detector 18 via switch S2. As described in the previously mentioned Eng et al patent, the microprocessor computes from the window detector output data D1 produced in response to these Vo inputs a set of "ladder bit" values L1–L6 which account for errors in the precision resistors used in the window detector. The microprocessor also computes from this data a gain correction factor E and an offset correction factor Z which reflect any gain or offset errors of devices within the window detector. The microprocessor 20 stores these factors L1–L6, Z and E in memory 34 for later use in correcting the output data D1 of the window detector according to a calibration equation described in the previously mentioned patent.

As a final calibration step, the relationship between a change in the offset voltage Voff produced by the signal generator 16 and changes in the digital input D2 is determined in order to calibrate the operation of the signal generator. A standard voltage (suitably +10 volts) from an accurate voltage source is applied as the input voltage Vin to converter 10 and this standard voltage is measured by the converter 10 in the same manner as any other input voltage. At the end of the measurement process, Voff will be approximately −10.013 volts in order to offset Vin' by the appropriate amount, and the digital output D1 will reflect the voltage difference between Voff and Vin'. The input data D2 to the duty cycle generator is then changed by 1 bit thereby causing a small change in the difference voltage Vo produced by the difference amplifier 14. The window detector 18 digitizes the new value of voltage Vo and produces a new output value D1 differing from the previous value of D1 by a small amount. The microprocessor 20 then computes the difference between the new and old values of D1, corrected by the previously mentioned calibration factors, and this difference represents the weight W of one bit of data D2 to be used when computing the magnitude of the voltage Vin'. More specifically, the data D2 is multiplied by W and then added to the corrected window detector output value D1 in order to obtain a digital quantity representing the input voltage Vin'. Vin is then determined by multiplying (or dividing) Vin' by the gain (or attenuation) of autoranging circuit 12. It should be noted that the calibration process requires no external equipment other than a standardized voltage source and requires no manual adjustment of controls.

Thus the converter 10 provides high resolution analog to digital conversion for a wide range of input voltages without requiring large numbers of precision components and without requiring manual adjustment or test equipment for calibration. While a preferred embodiment of the present invention has been shown and described, it will be apparent to those skilled in the art that many changes and modifications may be made without departing from the invention in its broader aspects. The appended claims are therefore intended to cover all such changes and modifications as fall within the true spirit and scope of the invention.

I claim:

1. The method of accurately measuring an input signal comprising the steps of:
   measuring said input signal to provide an estimate of the magnitude of said input signal;
   generating a periodic offset signal in response to said estimate, said offset signal being of a period adjusted so that said offset signal has a time-average magnitude differing from said estimate of the magnitude of said input signal by an amount that is less than a full scale input signals range of a signal magnitude measuring device and greater than a substantial portion of said full scale input signal range;
   offsetting said input signal by said offset signal to produce a difference signal;
   measuring a time-average magnitude of said difference signal with said signal magnitude measuring device; and
   ascertaining the magnitude of said input signal to an improved degree of resolution according to the magnitude of said offset signal and the measured magnitude of said difference signal.

2. The method of claim 1 wherein the signal magnitude measuring device measures the difference signal according to the steps of:
   amplifying the difference signal by a predetermined amplification factor to produce an amplified difference signal substantially larger in magnitude than said difference signal;
   measuring the amplified difference signal, said amplification factor being such that the amplified difference signal is measured with substantially full resolution of the signal magnitude measuring device; and
   ascertaining the magnitude of said difference signal according to the measured value of the amplified difference signal in combination with the amplification factor.

3. The method according to claim 1 wherein the step of measuring the magnitude of said input signal to provide an estimate of the magnitude of said input signal comprises the steps of:
   prescaling said input signal by a prescaling factor to produce a prescaled input signal of magnitude comprising a substantial portion of the full scale input signal range of a signal magnitude measuring device;
   measuring the prescaled input signal with said signal magnitude measuring device; and
   ascertaining said estimate of said input signal according to the measured value of the input signal and said scaling factor.

4. The method of accurately measuring an input signal comprising the steps of:
   measuring said input signal with a first degree of resolution to produce an estimate of the magnitude of said input signal;
   offsetting said input signal by an offset signal to produce a difference signal, the magnitude of the offset signal being adjusted to differ from the magnitude of the estimate by a non-zero value comprising a substantial portion of a limit of a full scale input signal range of a signal magnitude measuring device;

measuring the magnitude of said difference signal with said signal magnitude measuring device; and ascertaining the magnitude of said input signal to an improved degree of resolution according to the magnitude of said offset signal and the measured magnitude of said difference signal, wherein the signal magnitude measuring device measures the difference signal according to the steps of:

amplifying the difference signal by a predetermined amplification factor to produce an amplified difference signal;

measuring the amplified difference signal, said amplification factor being such that the magnitude of said amplified difference signal is measured with substantially full resolution of the signal magnitude measuring device; and ascertaining the magnitude of said difference signal according to the measured value of the amplified difference signal in combination with the amplification factor; and wherein the steps of measuring the amplified difference signal comprises the steps of:

developing a reference digital signal;

developing a reference analog signal in proportion to said reference digital signal;

comparing said amplified difference signal to said reference analog signal and adjusting said reference digital signal to modify said analog reference signal to a first value for which the magnitudes of said amplified difference signal and said reference analog signal have a first predetermined relationship;

amplifying a difference in magnitude between said amplified difference signal and said reference analog signal to develop a remainder signal;

storing the remainder signal;

comparing the stored remainder signal with said reference analog signal and adjusting said reference digital signal to modify said reference analog signal to a second value for which the magnitudes of said remainder signal and said reference analog signal have a second predetermined relationship; and ascertaining the magnitude of said amplified difference signal according the magnitudes of said reference digital signals and said remainder signals.

5. The method of accurately measuring an input signal comprising the steps of:

measuring said input signal with a first degree of resolution to produce a first representation of the magnitude of said input signal, generating a periodic offset signal in response to said first representation, said offset signal being of a period adjusted so that said offset signal has a time-averaged magnitude differing from said first representation of the magnitude of said input signal by an amount that is less than a full scale input signal range of a signal magnitude measuring device and greater than a substantial proportion of said full scale input signal range, offsetting said input signal by said offset signal to produce a difference signal, measuring a time-average magnitude of said difference signal with said signal magnitude measuring device to produce a second representation of the magnitude of said difference signal, and ascertaining the magnitude of said input signal to a second degree of resolution according to the magnitude of said offset signal and the measured magnitude of said difference signal, wherein the step of measuring the magnitude of said input signal to a first degree of resolution to produce a first representation of the magnitude of said input signal comprises the steps of:

prescaling the input signal by a predetermined first scaling factor to produce a first prescaled input signal within the input signal range of the signal magnitude measuring device;

measuring the first prescaled input signal with said signal magnitude measuring device;

prescaling said input signal by a second prescaling factor to produce a second prescaled input signal of magnitude comprising a substantial proportion of a limit of the measuring device, the magnitude of said second prescaling factor being determined according to the measured value of said first prescaled input signal;

measuring the second prescaled input signal with said signal magnitude measuring device; and ascertaining said first representation of the magnitude of said input signal according to the measured value of said second prescaled input signal and said second scaling factor.

6. The method of accurately measuring an input signal comprising the steps of:

measuring said input signal to a first degree of resolution to produce an estimate of the magnitude of said input signal;

offsetting said input signal by an offset signal to produce a difference signal, the magnitude of the offset signal being adjusted to differ from the magnitude of the estimate of the input signal by a value which, when amplified by a predetermined amplification factor substantially greater than one, comprises a substantial portion of a full scale limit of an input signal range of a signal magnitude measuring device;

amplifying said difference signal by said amplification factor;

measuring the magnitude of said amplified difference signal with said signal magnitude measuring device; and ascertaining the magnitude of said input signal according to the magnitude of said offset signal and the measured magnitude of said difference signal.

7. The method of accurately measuring an input signal comprising the steps of:

prescaling said input signal by a prescaling factor to produce a prescaled input signal of magnitude comprising a substantial portion of a signal limit of a full scale input signal range of a signal magnitude measuring device;

measuring the prescaled input signal with said signal magnitude measuring device to ascertain an estimate of the magnitude of said input signal according to the measured value of said prescaled input signal in combination with said scaling factor;

offsetting said input signal by said offset signal to produce a difference signal, the time averaged magnitude of said offset signal being adjusted such that the time average difference between the magnitude of the offset signal and the magnitude of the estimate of the input signal is a substantial portion of a limit of the full scale input signal range of a signal magnitude measuring device;

filtering and amplifying the difference signal;

measuring the magnitude of the filtered and amplified difference signal with said signal magnitude measuring device to determine a magnitude of said difference signal according to the measured value of the filtered, amplified difference signal and the amount of amplification of said difference signal; and ascertaining the magnitude of said input signal according to the time averaged magnitude of said offset signal and the measured magnitude of said difference signal.

8. An apparatus for accurately measuring an input signal comprising:
means for measuring the magnitude of said input signal to a first degree of resolution to produce an estimate of the magnitude of said input signal;
means for offsetting said input signal by an offset signal to produce a difference signal, the magnitude of the offset signal being adjusted to differ from the magnitude of the estimate of the input signal by a value which, when amplified by a predetermined amplification factor substantially greater than one, comprises substantial portion of a full scale limit of an input signal range of said means for measuring;
means for amplifying said difference signal by said amplification factor, the amplified difference signal being applied to and measured by said means for measuring; and
means for ascertaining the magnitude of said input signal according to the magnitude of said offset signal and the measured magnitude of said amplified difference signal.

9. The method of accurately measuring an analog input signal comprising the steps of:
generating digital control data;
developing a pulse width modulated offset signal of duty cycle determined by said digital control data;
producing an oscillating difference signal of magnitude proportional to a difference between the magnitudes of said offset and analog input signals;
producing first digital data representative of a time-averaged magnitude of the difference signal; and
computing the magnitude of said analog input signal according to the magnitudes of said digital control data and said first digital data.

10. The method of claim 9 wherein the steps of developing a pulse width modulated offset signal of duty cycle determined by said digital control data comprises the steps of:
providing a clock signal of constant period;
producing a periodic binary control signal having a duty cycle controlled by said digital control data and having a frequency controlled by said clock signal;
applying a first reference signal of constant magnitude of a switch; and
controlling the switching state of said switch by said periodic binary control signal such that said first reference signal is pulse width modulate with the duty cycle of said periodic binary control signal thereby to produce said offset signal.

11. The method accurately measuring an input signal comprising the steps of:
measuring the magnitude of said input signal to a first degree of resolution to produce an estimate of the magnitude of said input signal;
offsetting said input signal by a pulse-width modulated offset signal to produce a difference signal, the time average magnitude of the offset signal being determined according to the magnitude of the estimate of the input signal;
measuring the time average magnitude of said difference signal with a signal magnitude measuring device; and
ascertaining the magnitude of said input signal to a second degree of resolution according to the time averaged magnitude of said offset signal and the measured magnitude of said difference signal.

12. The method of claim 11 wherein the time averaged magnitude of said offset signal is adjusted such that the time average difference between the magnitude of the offset signal and the magnitude of the estimate of the input signal is a substantial portion of a limit of the full scale input signal range of said signal magnitude measuring device.

13. An apparatus for accurately measuring an input signal comprising:
means for measuring said input signal to a first degree of resolution to produce an estimate of the magnitude of said input signal;
means for offsetting said input signal by a pulse-width modulated offset signal to produce an oscillating difference signal, the magnitude of the offset signal being determined according to the magnitude of said estimate of the input signal;
means for filtering and amplifying the difference signal, the filtered amplified difference signal being applied to and measured by said means for measuring; and
means for ascertaining the magnitude of said input signal according to the time averaged magnitude of said offset signal and the measured time averaged magnitude of said difference signal.

14. The apparatus according to claim 13 wherein said means for offsetting comprises:
means for providing a reference signal of constant magnitude;
an oscillator for developing a clock signal of constant period;
a duty cycle generator, responsive to said clock signal, for producing a periodic binary control signal having a duty cycle determined according to said estimate and having a period proportional to the period of said clock signal; and
switch means responsive to said periodic binary control signal for pulse width modulating said reference signal thereby to produce said pulse width modulated signal.

15. An analog digital converter circuit comprising:
means for generating digital control data;
means for developing a pulse width modulated offset signal of duty cycle determined by said digital control data;
first difference amplifier means for receiving said offset signal and an analog input signal and for producing an oscillating difference signal of time average magnitude proportional to the time average difference between the magnitudes of said offset and analog input signals; and
means for producing first digital data representative of the magnitude of the difference signal, said first digital data in combination with said digital control data being indicative of the magnitude of said analog input signal.

16. The analog to digital converter according to claim 15 wherein said means for developing a pulse width modulated offset signal of duty-cycle determined by said digital control data comprises:
- means for providing a first reference signal of constant magnitude;
- an oscillator of developing a clock signal of constant period;
- a duty cycle generator, responsive to said clock signal and to said digital control data, for producing a periodic binary control signal having a duty cycle determined according to said digital control data, and having a period proportional to the period of said clock signal; and
- switch means responsive to said periodic binary control signal for pulse width modulating said first reference signal thereby to produce said pulse width modulated offset signal.

17. The analog to digital converter according to claim 15 wherein said first difference amplifier means comprises:
- a first amplifier responsive to said offset signal and to said analog input signal for offsetting said analog input signal by said offset signal;
- means for filtering said offset input signal thereby to produce a filtered offset input signal; and
- a second amplifier for amplifying said filtered offset input signal thereby to produce said difference signal.

18. The analog to digital converter according to claim 15 wherein said means for producing first digital data representative of the magnitude of the difference signal comprises a recirculating remainder analog to digital converter.

* * * * *